United States Patent [19]

Chrystie

[11] Patent Number: 4,833,419
[45] Date of Patent: May 23, 1989

[54] NON-INDUCTIVE RADIO APPARATUS

[76] Inventor: Henry Chrystie, 35218 Fir Ave., #29, Yuciapa, Calif. 92399

[21] Appl. No.: 114,678

[22] Filed: Oct. 29, 1987

[51] Int. Cl.$^4$ .............................................. H03F 3/189
[52] U.S. Cl. ..................................... 330/59; 330/109; 330/294; 330/305; 330/308; 455/340
[58] Field of Search ................. 330/59, 109, 294, 305, 330/308, 307; 331/141, 142; 455/150, 179, 191, 197, 199, 339, 340; 307/308; 250/370 B

[56] References Cited

U.S. PATENT DOCUMENTS 3,566,291  2/1971  Tice, Jr. .............................. 330/305

FOREIGN PATENT DOCUMENTS 1025709  4/1966  United Kingdom ................ 331/141

OTHER PUBLICATIONS

Barditch, "Adapting Conventional VHF Equipment to Molecular Electronics", *Electronic Design*, Feb. 17, 1964, pp. 44–51.

*Primary Examiner*—James B. Mullins
*Attorney, Agent, or Firm*—Sheldon & Mak

[57] ABSTRACT

A radio circuit apparatus for broadcast frequencies promotes micro miniaturization and avoids the production of unwanted radiation by incorporating tunable R-C circuits in place of inductive elements. The apparatus provides simultaneous tuning of RF, mixer, and local oscillator circuits by coupling variable radiation levels to a plurality of radiation-sensitive resistor elements in each circuit. In one configuration of the tuner portion, a rod having a radioactive coating is mounted coaxially within a cylindrical parallel array of resistor elements, the elements being connected in tunable Wien-bridge and/or twin-T circuits. An axially movable, cylindrical shutter is interposed between the rod and the resistor elements for variably blocking the radiation from the rod for tuning the circuits. In another configuration, a conductive plate is formed on the shutter for capacitive coupling to other plates placed in association with the resistor elements, the plates forming a pair of variable capacitors in a Wein-bridge circuit, the combination of variable resistors and capacitors compounding to extend the tuning range of the circuit. In another configuration, a variable voltage is coupled individually to an array of field-effect transistors that serve as the variable resistance elements. In a further configuration, a variably illuminated optical conduit is positioned adjacent to a plurality of photo-resistor elements, each element receiving a portion of light from the conduit. The apparatus can be configured as a transmitter as well as for reception.

19 Claims, 2 Drawing Sheets

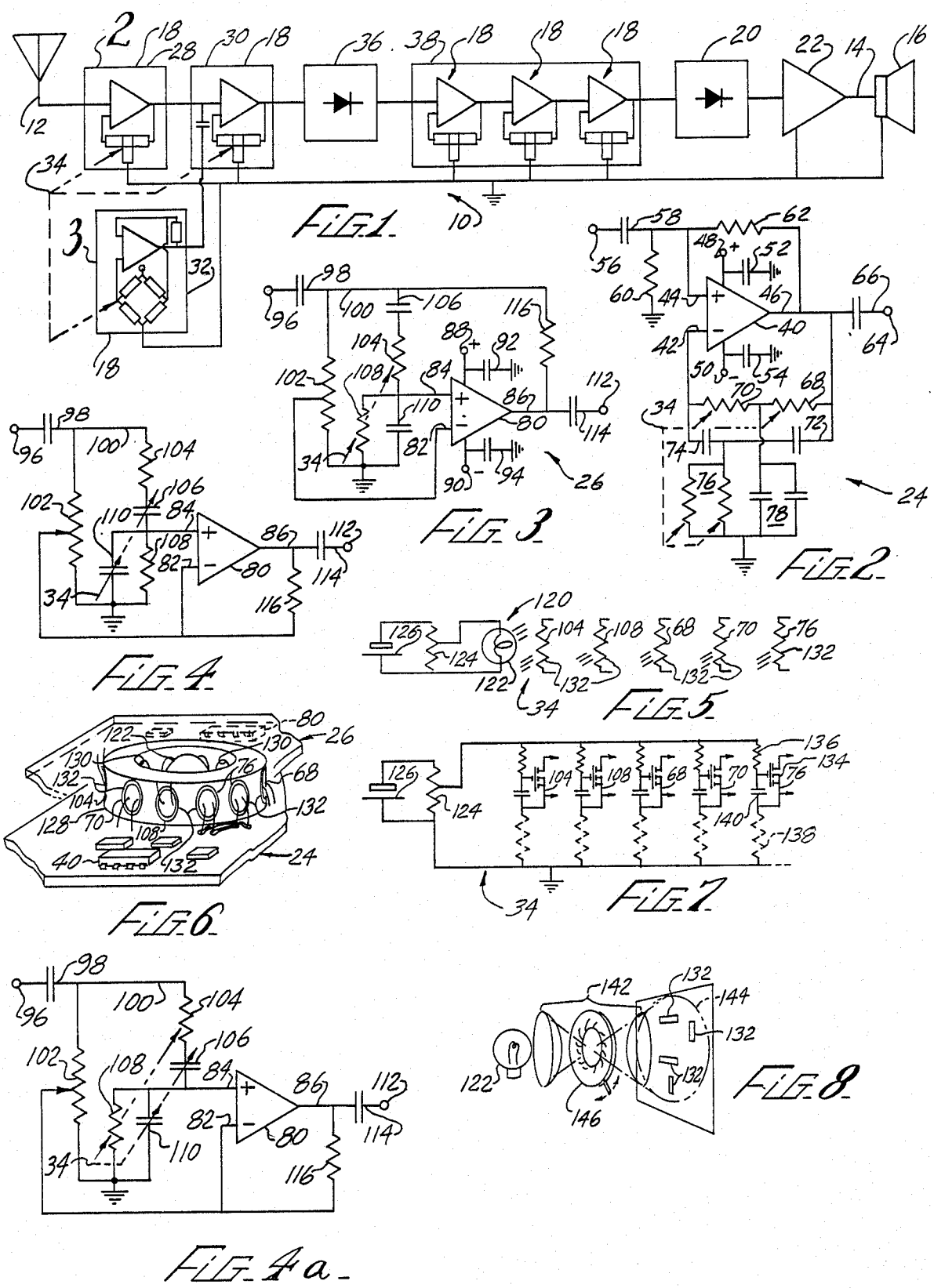

NON-INDUCTIVE RADIO APPARATUS

BACKGROUND

The present invention relates to radio communication, and more particularly to inductorless radio receiver and transmitter circuits.

In radio circuits of the prior art, inductive elements (coils, transformers, etc.) are commonly used in resonant filters, couplers, and other parts of radio tuners, oscillators, and amplifiers. It is desirable to avoid the use of inductors when miniaturization is sought because, at frequencies commonly encountered, the inductors are objectionably large. Indeed, although resistors, capacitors, and transistors are combined in increasingly dense integrated circuits, methods for producing inductors having appropriate characteristics in integrated circuits have not been devised.

Another problem with inductors in radio circuits is that they produce objectionable radiation. Such radiation can interfere with satisfactory operation of other portions of a system containing the inductors, and nearby equipment. Moreover, the electromagnetic radiation from the inductors of radio circuits can be detected and used for locating the circuit. This is a critical disadvantage in clandestine operations.

In tuning circuits it is also necessary to provide a high degree of selectivity, especially when many carriers are crowded within a narrow frequency band. Thus it is desired to have one or more tuned RF stages operating in conjunction with a variable local oscillator, the respective outputs being mixed for feeding an IF detector, one or more IF stages and a signal detector. Accordingly, it is often required to control a plurality of frequency determining elements in unison. In traditional radio circuits this was typically done by a ganged variable capacitor, each section thereof being connected in a separate frequency determining circuit. A disadvantage of such circuits is that the variable capacitors are quite bulky, in applications at conventional AM broadcast frequencies below about 1.6 Hz, and especially at low radio frequencies that extend below 250 KHz. When extreme miniaturization is sought, the bulk of variable reactance elements is a significant disadvantage even in the commercial FM band that extends up to about 125 MHz.

Voltage controlled oscillators (VCO's) are also used in radio receivers, thereby avoiding conventional tuning capacitors. However, these receivers usually do not include tuned RF stages because of the difficulties in tracking with the local oscillator frequency, and poor isolation between the control voltage and the various tuned circuits that would otherwise result; thus performance is often compromised.

Although tuned inductor circuits are commonly used in VCO's, these are bulky and produce objectionable radiation as noted above. Variable capacitance diodes (varactors) are sometimes used as the tuning element in VCO's, and can also be used to tune RF stages. However, these devices are best suited for higher frequency operation than the conventional AM broadcast frequencies of interest here. Also, the control voltage must be maintained relative to the potential of the tuned signal, with which there is limited isolation. Moreover, where a plurality of circuits are to be tuned in unison, they are difficult to match, and they may track poorly.

Thus there is a need for radio circuit apparatus for frequencies between 250 KHz and 125 MHz that is compatible in size with micro miniaturized integrated circuitry, that is easily and inexpensively produced, simple to tune, and does not produce objectionable radiation. This need is especially acute at frequencies below about 1.6 MHz.

SUMMARY

The present invention meets this need by providing radio circuit apparatus that includes no inductors, the tunable circuits of which incorporate variable impedance elements that respond in unison to a control input. In one aspect of the invention, a variable band-pass filtering amplifier for operation between about 250 KHz and about 125 MHz includes amplifier means, variable radiation means, and filter means for the amplifier, the filter means having two classes of impedance elements, at least two of the elements of one class having an impedance responsive to the radiation means for obtaining a desired band-pass frequency in response to a control input of the radiation means. The variable impedance elements can be photoresistors; the radiation means can include a variable illuminator, such as a lamp. Also, the radiation means can include a movable element for variably blocking radiation between a source and the variable impedance elements.

The source of radiation can be radioactive. In a preferred implementation, the source is formed as a cylindrical rod coaxially located equidistant from a cylindrical bundle of photoresistor elements, a cylindrical shutter being axially movable between the source and the bundle in response to rotation of a tuning screw.

In one preferred configuration, the amplifier is tunable from about 500 KHz to about 1.6 MHz in response to the control input for covering the conventional AM broadcast band. In another preferred configuration, the amplifier is similarly tunable from about 93 MHz to about 110 MHz.

In another aspect of the present invention, a radio circuit apparatus operable between 500 KHz and 1.6 MHz includes a plurality of tunable band-pass filtering amplifiers, each having amplifier means and associated filter means as described above, and tuning means for selecting a desired bandpass frequency, including radiation means, means for directing the radiation to the variable impedance elements of at least two of the amplifier circuits, and control means for simultaneously changing the impedance of the variable impedance elements. One of the amplifier circuits can be operable as a tunable local oscillator in response to the control input at a frequency appropriately offset from the desired frequency of reception. One of the amplifier circuits can include a Wien-bridge network. Alternatively, or in combination, one of the amplifier circuits can include a twin-T network.

In a further aspect of the present invention, a variable band-pass filtering amplifier includes amplifier means; band-pass filter means connected to the amplifier means and having resistive and capacitive impedance elements; at least two of the resistive impedance elements being variable resistors; tuning means for the filter means, including radiation means, means for directing radiation to the variable resistors, and a moveable element for simultaneously changing the amount of radiation reaching the variable resistors by blocking radiation from the source. The tuning means can include at least three of the variable resistors in a twin-T network.

Preferably, a capacitive element of the filter means is also variable, being formed by a moveable plate on the moveable element and a stationary plate in close proximity to the moveable plate when the moveable element is positioned for blocking the radiation. More preferably, a pair of the capacitive elements is variable, there being two of the stationary plates in close proximity with the moveable plate. The filter means can include a Wien bridge circuit, the tuning range thereof being extended by the simultaneous variation of the variable resistors and the variable capacitors.

These features of the present invention advantageously provide tunable circuits that are compatible with micro-miniaturized electronic production technology, yet do not produce objectionable radiation.

DRAWINGS

These and other features, aspects, and advantages of the present invention will become better understood with reference to the following description, appended claims, and accompanying drawings where:

FIG. 1 is a schematic block diagram of a radio receiver apparatus according to the present invention;

FIG. 2 is a schematic diagram of a circuit stage within region 2 of FIG. 1;

FIG. 3 is a schematic diagram of a circuit stage within region 3 of FIG. 1;

FIG. 4 is a schematic diagram showing an alternative configuration of the circuit stage of FIG. 3;

FIG. 4a is a schematic diagram showing another alternative configuration of the circuit stage of FIG. 3;

FIG. 5 is a schematic diagram showing tuning means for the circuit stages of FIGS. 2 and 3;

FIG. 6 is a fragmentary elevational perspective view of a circuit module incorporating the tuning means of FIG. 5;

FIG. 7 is a schematic diagram showing an alternative configuration of the tuning means of FIG. 5;

FIG. 8 is a perspective diagram showing another alternative configuration of the tuning means of FIG. 5;

FIG. 9a is a fragmentary sectional elevational view showing another alternative configuration of the tuning means of FIG. 5;

FIG. 10a is a fragmentary sectional elevational view of the apparatus of FIG. 9a on line 10a—10a of FIG. 9a;

DESCRIPTION

Figure 14:
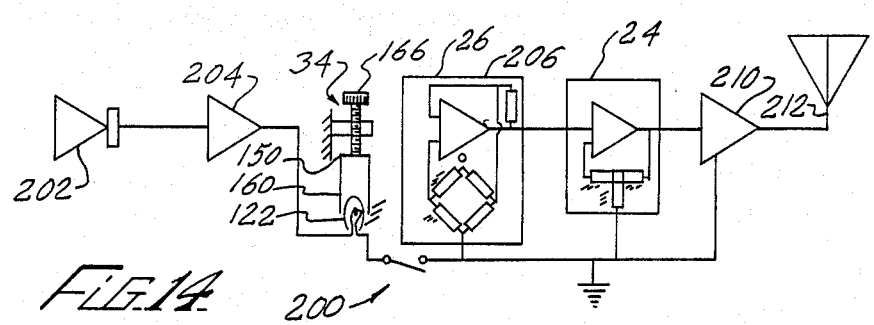
FIG. 14 is a schematic block diagram of a tunable FM transmitter according to the present invention.

The present invention is directed to a radio circuit apparatus that is compatible with micro miniaturized circuit technology, and that does not produce objectionable electromagnetic radiation. With reference to the drawings, particularly FIGS. 1-6, a radio receiver apparatus 10 according to the present invention has an antenna input 12, and an output 14 connected to a speaker 16. The apparatus 10 includes one or more band pass amplifier stages 18, a detector 20, and an audio amplifier 22 for driving the output 14.

Each band pass amplifier stage 18 can be configured as a twin-T stage 24 as shown in FIG. 2, or a Wien-bridge stage 26 as shown in FIG. 3. In the apparatus 10, a first RF stage 28 is connected between the input 12 and a second RF stage 30, the second RF stage 30 functioning as a mixer by virtue of capacitive coupling to the output of a local oscillator 32, the local oscillator 32 being formed by the Wien-bridge stage 26. The RF stages 28 and 30 are each formed from twin-T stages 24. It should be understood that each of the first and second RF stages 28 and 30, as well as the local oscillator 32, can be formed from either the twin-T stage 24 or the Wien-bridge stage 26.

The first and second RF stages 28 and 30, and the local oscillator 32, are operatively connected to a tuning means 34, further described herein, for selecting a desired signal from what is received at the input 12. The frequency of the local oscillator 32 is offset appropriately from the selected RF pass band for producing a desired IF frequency at the output of a first detector 36 that is driven by the second F stage 30, the IF frequency being normally the difference between the RF center frequency and that of the local oscillator 32. The first detector 36 drives an IF amplifier 38 that is formed from a plurality of the band pass amplifier stages 18, the amplifier stages 18 in the IF amplifier 38 being fixed-tuned to the IF frequency rather than being responsive to the tuning means 34. The detector 20 thus functions as a second detector, being driven by the IF amplifier 38.

With particular reference to FIG. 2, the twin-T stage 24 includes a differential amplifier 40 having an inverting input 42, a non-inverting input 44, an output 46, and appropriate power connections 48 and 50, the power connections 48 and 50 being provided with respective bypass capacitors 52 and 54. A signal input 56 is capacitively coupled by an input capacitor 58 to the non-inverting input 44 which is biased between ground and the output 46 by an input resistor 60 and a feedback resistor 62. A signal output 64 is capacitively coupled to the output 46, which is also connected to the inverting input 42 through a twin-T feedback circuit formed by arm resistors 68 and 70, arm capacitors 72 and 74, a leg resistor 76 and a leg capacitor 78. The leg resistor 76 and the leg capacitor 78 are each shown in FIG. 2 as a parallel pair because proper alignment is achieved when the leg resistor 76 has half the resistance of each of the arm resistors 68 and 70, and the leg capacitor 78 has double the capacitance of each of the arm capacitors 72 and 74.

With particular reference to FIG. 3, the Wien-bridge stage 26 includes a differential amplifier 80 having an inverting input 82, a non-inverting input 84, an output 86, and appropriate power connections 88 and 90, with respective bypass capacitors 92 and 94. A signal input 96 is capacitively coupled by an input capacitor 98 to an input node 100 of a grounded bridge network. The bridge network includes one branch having a pair of resistive arms, the arms being formed by a bridge balance potentiometer 102, the wiper of which is connected to the inverting input 82. The bridge network also includes a capacitively reactive branch that is connected to the non-inverting input 84 of the differential amplifier 80. The reactive branch is formed by a series resistor 104 and capacitor 106 connected between the input node 100 and the non-inverting input 84, and a parallel resistor 108 and capacitor 110 connected between the non-inverting input 84 and ground. The output 86 is capacitively coupled to a signal output 112 by an output capacitor 114, and a feedback resistor 116 is connected between the output 86 and the input node 100. The resistors 104 and 108 are variable in response to the tuning means 34, a common connection being provided to the non-inverting input 84 for ease of manufacture as described below. In an exemplary configuration of the present invention, the resistors 104 and 108 are variable in response to radiation from a source of radiation such as an illuminator, described below. Alternatively, the resistors 104 and 108 can be a ganged potentiometer. For proper alignment of the Wien-bridge stage 26, the capacitors 106 and 110 are of equal value, and the resistors 104 and 108 track with equal resistance in response to the tuning means 34.

In an alternative configuration of the Wien-bridge stage 26 shown in FIG. 4, the feedback resistor 116 is connected between the output 86 and the inverting input 82 of the differential amplifier 80. Also, instead of the resistors 104 and 108 being connected in common, the capacitors 106 and 110 are connected in common to the non-inverting input 84, the capacitors 106 and 110 being variable in response to the tuning means 34. In this configuration, the capacitors 106 and 110 can form a ganged variable capacitor.

The twin-T stage 24 and Wien-bridge stage 26 are each operable as the band pass amplifier stage 18 as described above. These circuits can also function as the local oscillator 32 when properly configured with sufficient positive feedback. In this case, no connection need be made to the signal input 56 of the twin-T stage 24 or the signal input 96 of the Wien-bridge 26, and the input capacitors 58 and 98 can be left out.

With further reference to FIGS. 5 and 6, an exemplary embodiment of the tuning means 34 includes a source 120 of radiation, the source 120 comprising an illuminator 122 connected by a potentiometer 124 to a voltage source 126. The radiation-responsive resistors 68, 70, 76, 104, and 108 are arranged to receive radiation from the source 120 for variably tuning the twin-T stage 24 and the Wien-bridge 26 as described above. As shown in FIG. 6, a housing 128 encloses the illuminator 122, the housing 128 having a plurality of cavities 130 for receiving a plurality of photo-resistors 132, the photo-resistors 132 being located equidistant from the illuminator 122. For convenience in manufacture, the resistor 76 of the twin-T stage 24 can be provided by a parallel-connected pair of the photo-resistors 132 for utilizing a single characteristic resistance in each of the photo-resistors 132, as depicted in FIG. 2. In this configuration, the potentiometer 124 functions as a control input for the tuning means 34.

In an alternative configuration of the tuning means 34 shown in FIG. 7, an array of field-effect transistors 134 function as the resistors 68, 70, 76, 104, and 108 of the twin-T stage 24 and the Wien-bridge 26. The output of the potentiometer 124 is connected to the gate of each field-effect transistor 134 by a respective gate resistor 136. By virtue of being connected in the circuitry of the respective twin-T stage 24 and Wien-bridge 26, the drain of each field-effect transistor 134 is DC-biased toward ground potential through an equivalent network resistance 138. A bias capacitor 140 connected between the gate and drain of each field-effect transistor 134 forces the gate of each of the field-effect transistors to substantially track the signal present on the respective drain, so that the voltage between the gate and drain of each field-effect transistor is maintained at a slowly variable level in response to the output of the potentiometer 124. Thus the effective resistance of each of the field-effect transistors 134 is controlled simultaneously by the potentiometer 124. For this purpose, each gate resistor 136 has a resistance substantially greater than the network resistance 138, typically on the order of one megohm.

In another configuration of the tuning means 34, the radiation from the illuminator 122 is projected onto a surface containing the photo-resistors 132 by a lens system 142, the lens system 142 providing substantially uniform illumination of the surface within a field 144. A variable iris 146 is provided at the node point of the lens system 142 for variably attenuating the radiation from the illuminator 122, while maintaining uniform illumination within the field 144. In this configuration, tuning of the apparatus 10 is accomplished varying the brightness of the illuminator 122, by varying the opening of the iris 146, or by a combination of the two.

Figures 9, 10:
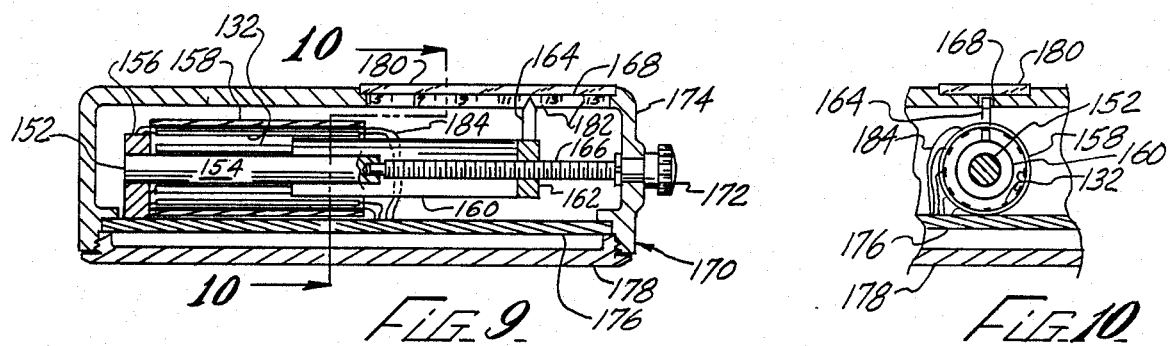
FIG. 9 is a sectional elevational view of the apparatus of FIG. 1 incorporating another alternative configuration of the tuning means of FIG. 5.
FIG. 10 is a fragmentary sectional elevational view taken on line 10—10 of FIG. 9.

With further reference to FIGS. 9–11, and 14, another configuration of the tuning means 34 provides a movable shutter 150 that variably blocks radiation between the source 120 and the resistors 68, 70, 76, 104, and 108 of FIG. 5. With particular reference to FIG. 9, the source 120 is provided by a cylindrical rod 152 having a radio-active coating 154. Preferably the coating comprises an active material that decays extremely slowly. It is expected that a suitable material for the coating 154 includes uranium $U_{238}$ which has a half-life of 5 billion years. The rod 152 is fixedly supported at one end by a mount 156, a tubular member barrel 158, concentrically enclosing the rod 152, has the photo-resistors 132 formed on the inside thereof in spaced relation with rod 152.

The shutter 150 includes a cylindrical tube member 160, a end wall thereof forming a nut member 162, and a tab member 164 extending radially outwardly from the nut member 162. A tuning screw 166 rotatably mounted concentric with the rod 152 at one end thereof opposite the block 156, threadingly receives the nut member 162 of the shutter 150, the tab member 164 being slidingly received in a slot 168 for preventing rotation of the shutter 150.

By rotating the tuning screw 166, the tube member 160 of the shutter 150 is caused to move axially in the space between the rod 152 and the photo-resistors 132, thereby tuning the RF stages 28 and 30 and the local oscillator 32 of the apparatus 10. The tuning screw 166 thus functions as the control input of the tuning means 34. As further shown in FIG. 9, the tuning means 34 can be enclosed in a housing 170, the housing 170 having a configuration similar to that of a conventional wristwatch case. Accordingly, a knob 172 of the tuning screw 166 protrudes a case 174 of the housing 170 and is positioned in a similar manner to the stem of a conventional wristwatch. A substrate 176, with the block 156 mounted thereon, for mounting the circuits of the apparatus 10 is fixedly mounted within the case 174, being secured by a threaded lid 178. The slot 168 is formed in the case 174, a window 180 sealingly covering the slot 168 for viewing the position of the tab member 164. Tuning indicia 184 are provided along the slot 168 for correlating the position of the tab member 164 with a selected position of the shutter 150.

The photo-resistors 132 are linear in form, being elongated in the direction of the rod 152, forming a cylindrical bundle of the photo-resistors 132. Thus the axial position of the tube member 160 of the shutter 150 has the same effect on each of the photo-resistors 132. It should be understood that the resistors 76 of the twin T stage 24 can be formed of a pair of the photo-resistors 132 as described above. Alternatively, the resistors 76 can be formed just as the resistors 68 and 70, but having double the width in a single element.

Figures 11, 12, 13:
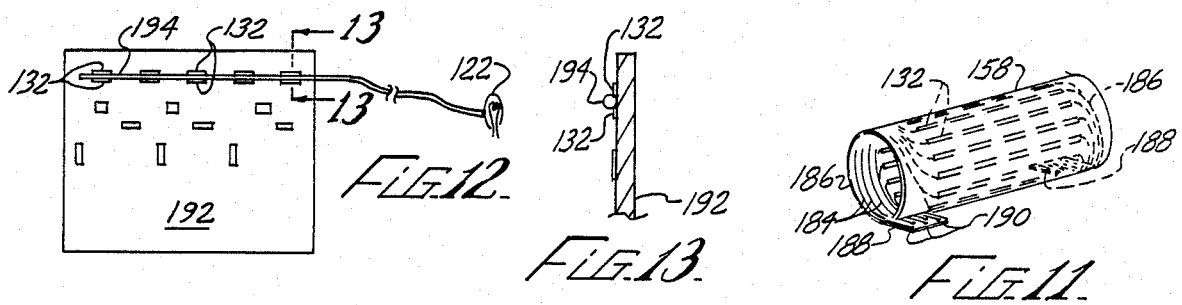
FIG. 11 is a perspective detail view showing an alternative configuration of the apparatus of FIG. 9.
FIG. 12 is a plan diagram view showing an alternative configuration of the module of FIG. 6.
FIG. 13 is a fragmentary sectional detail view of the module of FIG. 12 on line 13—13 of FIG. 12.

Electrical connection between the photo-resistors 132 within the barrel 158 and other circuitry on the substrate 176 can be effected by connecting individual conductors 184 between respective photo-resistors 132 and the other circuit elements. Alternatively, the conductors 184 can be formed as a circuit pattern directly on the barrel 158 as shown in FIG. 11. In this variation, the barrel 158 is formed in flat-pattern from a flexible member 186, then wrapped into a cylindrical form. The flexible member 186 extends axially beyond the photo-resistors 132 for carrying the conductors 184, the conductors 184 being formed by etching, deposition, or the like. A tab member 188 is formed in the flexible member 186 at each end of the barrel 158 for mounting to the substrate 176, each tab member having appropriate electrical terminations 190 for the respective conductors 184 for connection to corresponding terminations (not shown) on the substrate 176.

In order for the tuning means 34 to simultaneously tune two of the twin-T stages 24 (the first and second RF stages 28 an 30) and a single Wien-bridge stage 26 (the local oscillator 32), a compliment of eight of the photo-resistors 132 are included in the barrel 158 of the tuning means 34. If each resistor 76 is formed of two of the photo-resistors 132, the compliment of the photo-resistors 132 is increased to ten. As shown in FIG. 10, there are twelve of the photo-resistors 132 spaced apart within the barrel 158. If needed or desired, this number can be adjusted appropriately to accommodate any number of tuned stages.

Figures 9A, 10A:
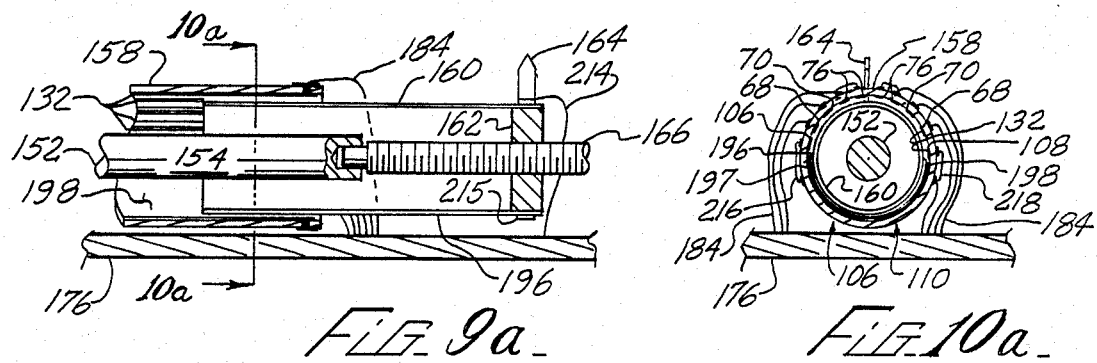

In another version of the tuning means 34, shown in FIGS. 9a and 10a, both resistive and capacitively reactive elements of the band pass amplifier stage 18 are responsive to the control input. FIG. 4a shows, for example, both the series resistor 104 and the parallel resistor 108, as well as the series capacitor 106 and parallel capacitor 110 being operatively connected to the tuning means 34 of the Wien-bridge stage 26.

The capacitors 106 and 110 are formed between the tube member 160 of the shutter 150 and the barrel 158 by electrically connecting a conductive plate 196 formed on the outside of the tube member 160 to the non-inverting input 84 of the differential amplifier 80, and by providing separate conductive plates, designated plate 197 and 198 in FIG. 10a, on the inside of the barrel 158.

As shown in FIG. 9a, a flexible conductor 214 is connected at one end thereof to the tab member 164, the tab member 164 being made conductive and having a ring portion 215 that extends to the plate 196, making electrical contact therewith. The other end of the conductor 21 is connected to the non-inverting input 84, on the substrate 176.

The tube member 160 is made only slightly smaller in diameter than the inside of the barrel 158 for close proximity between the plate 196 and the facing plates 197 and 198 when the shutter 150 is advanced into the barrel 158. The plates 196 and 198 are also made congruent for matching of the capacitors 106 and 110 over the range of axial movement of the shutter 150. The plates 196 and/or 197 and 198 may have a thin dielectric coating to alter the capacitance between them and to prevent short circuiting. In addition, the plates 196 and/or 197 and 198 may be physically shaped so as to obtain the most advantageous variation of capacitance as the tuning knob 172 is adjusted. Further, the photoresistors 132 can be shaped for producing a non-linear resistance characteristic with respect to the position of the shutter 150, thereby avoiding crowding of the selected stations near the upper limit of the tuning range. Moreover, the shaping of the plates 196 and/or 197 and 198 can be combined with the shaping of the photoresistors 132.

The plate 197 is directly connected by a jumper 216 to the series resistor 104 and the plate 198 is connected by a jumper 218 to ground at one end of the resistor 108, completing the Wien-bridge stage 24 shown in FIG. 4a. The jumpers 216, 218 and conductors 184 are shown attached to the outside of the barrel 158 with appropriate connections being made through to the plates 197, 198 and photoresistors 132, such as by plated through holes. As also shown in FIG. 9a, additional photoresistors 132 are provided for two of the twin-T stages 24, including two each of the resistors 68, 70, and resistor pairs 76, with appropriate connections to the substrate 176 by the conductors 184. The connections are to the outside of the barrel 158 for facilitating the closely spaced relationship between the plate 196 on the tube member 160 and the plates 197 and 198 on the inside of the barrel 158, and for avoiding stray capacitance between these connections and the plate 196. Alternatively, at least some interconnections can be made on the inside of the barrel 158.

In operation, axial movement of the tube member 160 of the shutter 150 by the tuning screw 166 brings a desired area of the tube member 160 in close proximity with the plates 197 and 198, while simultaneously changing the quantity of radiation from the coating 154 that reaches the resistors 104 and 108. Advancement of the tube member 160 into the barrel 158 simultaneously increases the capacitance of the capacitors 106 and 110 and increases the resistances of the resistors 104 and 108, the resonant frequency of the Wien-bridge stage 26 being lowered in a compound manner by the simultaneous changes in both resistance and capacitance, thereby advantageously providing greater dynamic tuning range than would otherwise be obtained.

In a further version of the tuning means 34, the photo-resistors 132 are located on a micro circuit chip 192 proximate an optical conduit 192. As shown in FIG. 12, the conduit 194 extends from the chip 194 to a remotely located illuminator 122. As further shown in FIGS. 12 and 13, the photo-resistors 132 can be located in pairs proximate opposite sides of the conduit 194. Uniform response of the photo-resistors 132 to the brightness of the illuminator 122 can be achieved by localized abrasion of the conduit 194 to proximate selected ones of the photo-resistors 132.

The radio circuit apparatus of the present invention is advantageously suitable for providing a variety of receiver and transmitter circuits. An exemplary tunable FM transmitter 200 is shown in FIG. 14. The transmitter 200 includes a microphone 202 coupled to an audio amplifier 204 for driving the illuminator 12 of the tuning means 34. An oscillator 206 formed by the Wien-bridge stage 26 is thus frequency modulated by variations in the brightness of the illuminator 122 in response to audio signals from the microphone 202. The center frequency of the oscillator 206 is controlled by the shutter 150 of the tuning means 34. The output of the oscillator 206 drives a twin-T stage. 24, the twin-T stage 24 also being tuned by the tuning means 34. The output of the twin-T stage 24 is fed to a RF power amplifier 210 for driving an antenna 212.

Figure 15:
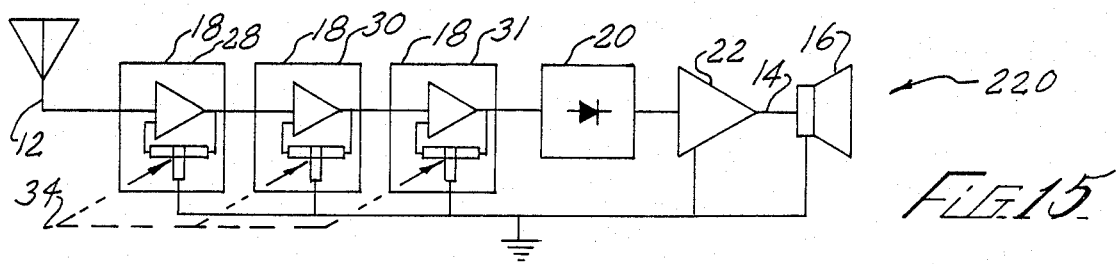
FIG. 15 is a schematic block diagram of a tuned radio frequency (TRF) receiver according to the present invention.

The present invention also provides a tuned radio frequency (TRF) receiver 220 as shown in FIG. 15. In the TRF receiver 220, which is a simplified alternative to the receiver apparatus 10 of FIG. 1, the band pass amplifier stages 18 feed the detector 20 directly. Three of the band pass amplifier stages 18 are shown serially connected, the first and second RF stages 28 and 30 of FIG. 1, and a third RF stage 31. Any number of RF stages can be used, the present invention advantageously facilitating the incorporation of several such stages that are tuned in unison by the tuning means 34 from a single control input.

Although the present invention has been described in considerable detail with reference to certain preferred versions thereof, other versions are possible. For example, the coating 154 can be applied to the tube member 160 of the shutter 150, the rod 152 being omitted. Also, the illuminator 122 and the conduit 194 can be integrated on the micro circuit chip 192. Further, the devices described herein are not necessarily confined to the frequencies cited. For example, a variety of instruments operating at audio frequencies (oscillators, wave analyzers, noise and distortion meters, etc.) may be made using the schemes described herein. Therefore, the spirit and scope of the appended claims should not necessarily be limited to the description of the preferred versions contained herein.

What is claimed is:

1. A variable band-pass filtering amplifier for operation at a selected operating range of radio frequencies within a broad range between 250 KHz and 125 MHz, comprising:
   (a) amplifier means responsive to an input signal to produce an output signal;
   (b) variable radiation means responsive to a control input, comprising:
      (i) a radiation source; and
      (ii) a cylindrical member located coaxially relative to the radiation source, the cylindrical member being movable in response to the control input; and
   (c) filter means operatively connected to the amplifier means for producing band-pass frequency response about a desired frequency, the filter means having first and second impedance classes, the first class comprising a plurality of variable impedance elements, the variable impedance elements forming a cylindrical array of the elements, the array being located coaxially relative to the cylindrical member and the radiation source and having an impedance responsive to the radiation means,
   whereby the desired frequency is variable in response to changes in the position of the cylindrical member relative to the array as controlled by the control input, the cylindrical member variably blocking radiation between the radiation source and the variable impedance elements.

2. The amplifier of claim 1 wherein the variable impedance elements of the first class comprise photoresistors.

3. The amplifier of claim 1 wherein the radiation source is radioactive.

4. The amplifier of claim 1 further comprising a tuning screw for axially moving the cylindrical member.

5. The amplifier of claim 1 wherein the desired frequency is tunable from approximately 500 KHz to approximately 1.6 MHz in response to the control input.

6. The amplifier of claim 1 wherein the desired frequency is tunable from approximately 93 MHz to approximately 110 MHz in response to the control input.

7. The amplifier of claim 1 wherein the second impedance class of the filter means comprises at least one variable capacitor having a first plate fixed relative to the cylinder member and a second plate fixed relative to the array of variable impedance elements of the first class.

8. The amplifier of claim 7 further comprising a second variable capacitor, the second variable capacitor being formed between the first plate and a third plate, the third plate being fixed relative to the variable resistors.

9. The amplifier of claim 8 wherein the filter means comprises a Wien-bridge network including the first and second variable capacitors and a pair of the variable resistors.

10. A radio circuit apparatus for operation at a selecting range of frequencies within a broad range between 250 KHz and 125 MHz, comprising:
    (a) a plurality of variable band-pass filtering amplifiers, each amplifier comprising:
       (i) amplifier means responsive to an input signal to produce an output signal;
       (ii) filter means operatively connected to the amplifier means for producing band-pass frequency response about a desired frequency; the filter means having first and second impedance classes, the first class comprising at least two variable impedance elements; and
    (b) tuning means for selecting a band-pass frequency of a desired radio signal, comprising:
       (i) radiation means;
       (ii) means for directing radiation from the radiation means to the variable impedance elements of the filter means of at least two of the amplifier circuits; and
       (iii) control means for simultaneously changing the amount of radiation reaching each of the variable impedance elements responsive to a control input;
    whereby the desired frequency responds to variation of the control input, and
    wherein the radiation source is radioactive.

11. A radio circuit apparatus for operation at a selected operating range of frequencies within a broad range between 250 KHz and 125 MHz, comprising:
    (a) a plurality of variable band-pass filtering amplifiers, each amplifier comprising:
       (i) amplifier means responsive to an input signal to produce an output signal;
       (ii) filter means operatively connected to the amplifier means for producing band-pass frequency response about a desired frequency, the filter means having first and second impedance classes, the first class comprising at least two variable impedance elements; and
    (b) tuning means for selecting a band-pass frequency of a desired radio signal, comprising:
       (i) radiation means;

(ii) means for directing radiation from the radiation means to the variable impedance elements of the filter means of at least two of the amplifier circuits; and (iii) control means for simultaneously changing the amount of radiation reaching each of the variable impedance elements responsive to a control input;

whereby the desired frequency responds to variation of the control input, and wherein one of the amplifier circuits is operable as a tunable local oscillator in response to the control input at an oscillator frequency, the oscillator frequency being offset by a predetermined frequency from the desired frequency.

12. A variable band-pass filtering amplifier comprising:

(a) amplifier means responsive to an input signal to produce an output signal;

(b) filter means operatively connected to the amplifier means for producing band-pass frequency response about a desired frequency, the filter means having resistive and capacitive impedance classes, the resistive class comprising at least two variable resistors, the capacitive class comprising at least one variable capacitive element;

(c) tuning means for selecting a band-pass frequency, comprising:

(i) radiation means;

(ii) means for directing radiation from the radiation means to the variable resistors of the filter means; and (iii) control means for simultaneously changing the resistance of the variable resistors and the capacitance of the variable capacitive element, comprising means for changing the amount of radiation reaching each of the variable resistors;

whereby the desired frequency responds to the control means.

13. The amplifier of claim 12 including at least three of the variable resistors in a twin-T network.

14. The amplifier of claim 12 wherein the control means comprises a movable element, and the variable capacitive element is a variable capacitor, the variable capacitor having a first plate fixed to the movable element and a second plate fixed relative to the variable resistors.

15. The amplifier of claim 14 wherein the filter means comprises a Wien-bridge circuit.

16. The amplifier of claim 14 further comprising a second variable capacitor, the second variable capacitor being formed between the first plate and a third plate, the third plate being fixed relative to the variable resistors.

17. A variable band-pass filtering amplifier for operation at a selected operating range of radio frequencies within a broad range between 250 KHz and 125 MHz, comprising:

(a) amplifier means responsive to an output signal to produce an output signal;

(b) variable radiation means responsive to a control input, comprising:

(i) a radioactive source; and (ii) a movable element;

(c) filter means operatively connected to the amplifier mean for producing band-pass frequency response about a desired frequency, the filter means having first and second impedance classes, the first class comprising at least two variable impedance elements, each of the variable impedance elements having an impedance responsive to the radiation means, whereby the desired frequency is variable in response to changes in the control input, the movable element variably blocking radiation between the radiation source and the variable impedance elements in response to the control input.

18. A variable band-pass filtering amplifier for operation at a selected operating range of radio frequencies within a broad range between 250 KHz and 125 MHz, comprising:

(a) amplifier means responsive to an input signal to produce an output signal;

(b) variable radiation means responsive to a control input, comprising:

(i) a cylindrical rod comprising a radioactive material and forming a radiation source; and (ii) partition means comprising a cylindrical member movably mounted coaxially with the rod for variably blocking radiation from the radiation source;

(c) filter means operatively connected to the amplifier means for producing band-pass frequency response about a desired frequency, the filter means having first and second impedance classes, the first class comprising at least two variable impedance elements, each of the variable impedance elements having an impedance responsive to the radiation means, the variable impedance elements forming a cylindrical array coaxially located about the rod and the cylindrical member;

whereby the desired frequency is variable in response to changes in the control input, the partition means variably blocking radiation between the radiation source and the variable impedance elements in response to the control input.

19. The amplifier of claim 18 further comprising a tuning screw for axially moving the cylindrical member.

* * * * *